US012580012B2

(12) United States Patent
Baek

(10) Patent No.: US 12,580,012 B2
(45) Date of Patent: Mar. 17, 2026

(54) MAGNETIC MEMORY IN DUAL MODE AND AI MEMORY THEREOF

(71) Applicant: KOREA INSTITUTE OF SCIENCE AND TECHNOLOGY, Seoul (KR)

(72) Inventor: Seung Heon Baek, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 102 days.

(21) Appl. No.: 18/680,504

(22) Filed: May 31, 2024

(65) Prior Publication Data

US 2025/0299714 A1 Sep. 25, 2025

(30) Foreign Application Priority Data

Mar. 20, 2024 (KR) ......................... 10-2024-0038525

(51) Int. Cl.
| | |
|---|---|
| *G06N 20/00* | (2019.01) |
| *G06N 5/04* | (2023.01) |
| *G11C 11/16* | (2006.01) |

(52) U.S. Cl.
CPC .............. *G11C 11/161* (2013.01); *G06N 5/04* (2013.01); *G06N 20/00* (2019.01); *G11C*

*11/1659* (2013.01); *G11C 11/1673* (2013.01); *G11C 11/1675* (2013.01); *G11C 11/1693* (2013.01)

(58) Field of Classification Search
CPC .............. G11C 11/161; G11C 11/1659; G11C 11/1673; G11C 11/1675; G11C 11/1693; G06N 20/00; G06N 5/04
USPC ......................................................... 365/158
See application file for complete search history.

(56) References Cited

U.S. PATENT DOCUMENTS

2019/0259810 A1* 8/2019 Jacob ..................... G11C 11/161
2024/0339417 A1* 10/2024 Katti ..................... H01L 23/552

* cited by examiner

*Primary Examiner* — Ly D Pham
(74) *Attorney, Agent, or Firm* — NSIP Law

(57) ABSTRACT

A magnetic memory operating in dual mode of the present disclosure includes a three-layer MTJ stack including a fixed layer with magnetization fixed by magnetic tunnel junction stack, a free layer with non-fixed magnetization, and a tunnel barrier layer disposed therebetween, wherein the magnetic memory operates in a volatile mode and a non-volatile mode by switching an energy barrier to one of a first state and a second state lower than the first state by an electric field applied to both ends of the MTJ stack.

20 Claims, 13 Drawing Sheets

MAGNETIC MEMORY IN DUAL MODE AND AI MEMORY THEREOF

CROSS-REFERENCE TO RELATED APPLICATIONS

This application claims the benefit under 35 USC 119(a) of Korea Patent Application No. 10-2024-0038525 filed on 20 Mar. 2024, in the Korean Intellectual Property Office, the entire disclosure of which is incorporated herein by reference for all purposes.

BACKGROUND OF THE INVENTION

Field of the Invention

The present disclosure relates to a magnetic memory operating in a volatile mode and a non-volatile mode and a memory for artificial intelligence based on the magnetic memory.

Description of the Related Art

Magnetic RAM is a memory that stores data through resistance differences caused by magnetization. This magnetic memory uses a device called a magnetic tunnel junction (MTJ) (hereinafter referred to as a 'stack') to store data using resistance.

The stack has a three-layer structure in which two ferromagnetic layers sandwich a non-magnetic layer. The free layer, one of the two ferromagnetic layers, is a layer that is relatively easy to change the direction of magnetization, and the other reference layer is a layer in which the direction of magnetization is fixed because it is made of a very strong magnetic material. The reason for this difference is that the energy barriers of the two layers are different.

Magnetic memory stores or writes data by changing the direction of magnetization of the free layer. The reason why data can be stored according to the direction of magnetization of the free layer is because of the Tunnel Magneto Resistance (TMR) effect that is if the magnetization direction of the free layer is the same as that of the fixed layer, the resistance decreases (logic 0), and if it is different, the resistance increases (logic 1).

Meanwhile, artificial intelligence performs two tasks: learning and inferring. Learning refers to the process of creating a learning model based on collected data, and inference refers to the process of obtaining results by inputting new data into the created learning model.

Among these, because the learning process requires a lot of data, power consumption, computing power, etc., so far, this learning process has only been performed on the server side.

However, if you want to store artificial intelligence in an edge device, there are limitations to implementation with the current memory form because the above-mentioned problems must be solved.

SUMMARY OF THE INVENTION

The present disclosure is created in this technical background and aims to drive magnetic memory in volatile mode and non-volatile mode.

Another purpose of the present disclosure aims to drive a magnetic memory capable of low-power operation in dual mode so that it can be used as a memory for artificial intelligence in an edge device.

In order to solve the above technical problem, a magnetic memory operating in dual mode of the present disclosure includes a three-layer MTJ stack including a fixed layer with magnetization fixed by magnetic tunnel junction stack, a free layer with non-fixed magnetization, and a tunnel barrier layer disposed therebetween, wherein the magnetic memory operates in a volatile mode and a non-volatile mode by switching an energy barrier to one of a first state and a second state lower than the first state by an electric field applied to both ends of the MTJ stack.

The volatile mode may be a mode in which the energy barrier is in the second state, and data may be read or written in the volatile mode, and, the data may be stored during the non-volatile mode.

The volatile mode and the non-volatile mode may be determined by a ground voltage applied to one end of the MTJ stack and a mode control signal applied to the other end.

The mode control signal may be applied to the MTJ stack through a switch that is turned on/off by a blinking signal.

The magnetic memory may be Spin-Orbit Torque Magnetic Random-Access Memory (SOT-MRAM).

The volatile mode may be formed by an electric field directed from the free layer to the fixed layer.

A ground voltage may be applied to the fixed layer, and a mode control signal higher than the ground voltage may be applied to the free layer.

The ground voltage may be applied through a source line, and the mode control signal may be applied through a bit line when a first switch is turned on by a blinking signal input through a read word line.

The non-volatile mode may be formed by an electric field directed from the fixed layer to the free layer.

A ground voltage may be applied to the free layer, and a mode control signal higher than the ground voltage may be applied to the fixed layer.

The ground voltage may be applied through a bit line when a first switch is turned on by a blinking signal input through a read word line, and the mode control signal may be applied through a source line.

The magnetic memory may be Spin Transfer Torque Magnetic Random-Access Memory (STT-MRAM).

The volatile mode may be formed by an electric field directed from the free layer to the fixed layer.

A ground voltage may be applied to the fixed layer, and a mode control signal higher than the ground voltage may be applied to the free layer.

The ground voltage may be applied through a bit line, and the mode control signal may be applied through a source line when a first switch is turned on by a blinking signal input through a word line.

The non-volatile mode may be formed by an electric field directed from the fixed layer to the free layer.

A ground voltage may be applied to the free layer, and a mode control signal higher than the ground voltage may be applied to the fixed layer.

The ground voltage may be applied through a source line when the first switch is turned on by a blinking signal input through a word line, and the mode control signal may be applied through a bit line.

Another embodiment of the present disclosure relates to a memory for artificial intelligence that stores the artificial intelligence in an edge device, the memory is a magnetic memory according to the above-described configuration, the magnetic memory operates in an inference mode and a learning mode by switching an energy barrier to one of a first state and a second state lower than the first state by an electric field applied to both ends of the MTJ stack, the learning mode is a mode that operates to read and write data to update the artificial intelligence, and the inference mode is a mode that only reads data.

According to the present disclosure, magnetic memory, which is a non-volatile memory, can be operated as a volatile memory, so the magnetic memory can have NAND-level capacity and SRAM-level speed.

Additionally, according to the present disclosure, since a magnetic memory capable of low-power operation can operate in dual mode, it can also be used as a semiconductor for artificial intelligence in edge devices.

DETAILED DESCRIPTION OF THE EMBODIMENTS

Hereinafter, embodiments of the present disclosure will be described in detail with reference to the drawings. However, detailed descriptions of known functions or configurations that may obscure the gist of the embodiments are omitted in the following description and attached drawings. In addition, throughout the specification, 'including' a certain component does not mean excluding other components unless specifically stated to the contrary, but rather means that other components may be further included.

Additionally, terms such as first, second, etc. may be used to describe various components, but the components should not be limited by the above terms. The above terms may be used for the purpose of distinguishing one component from another component. For example, a first component may be referred to as a second component without departing from the scope of the present disclosure, and similarly, the second component may also be referred to as the first component.

The terms used in the present disclosure are only used to describe specific embodiments and are not intended to limit the present disclosure. Singular expressions include plural expressions unless the context clearly indicates otherwise. In the present disclosure, terms such as "comprise" or "include" are intended to designate the presence of described features, numbers, steps, operations, components, parts, or combinations thereof, and it should be understood that this does not exclude in advance the presence or addition of one or more other features, numbers, steps, operations, components, parts, or combinations thereof.

Unless specifically defined otherwise, all terms used herein, including technical or scientific terms, have the same meaning as generally understood by a person of ordinary skill in the technical field to which the present disclosure pertains. Terms such as those defined in commonly used dictionaries should be interpreted as having a meaning consistent with the meaning in the context of the related technology, and unless clearly defined in the present disclosure, should not be interpreted in an idealized or excessively formal meaning.

Figure 1:
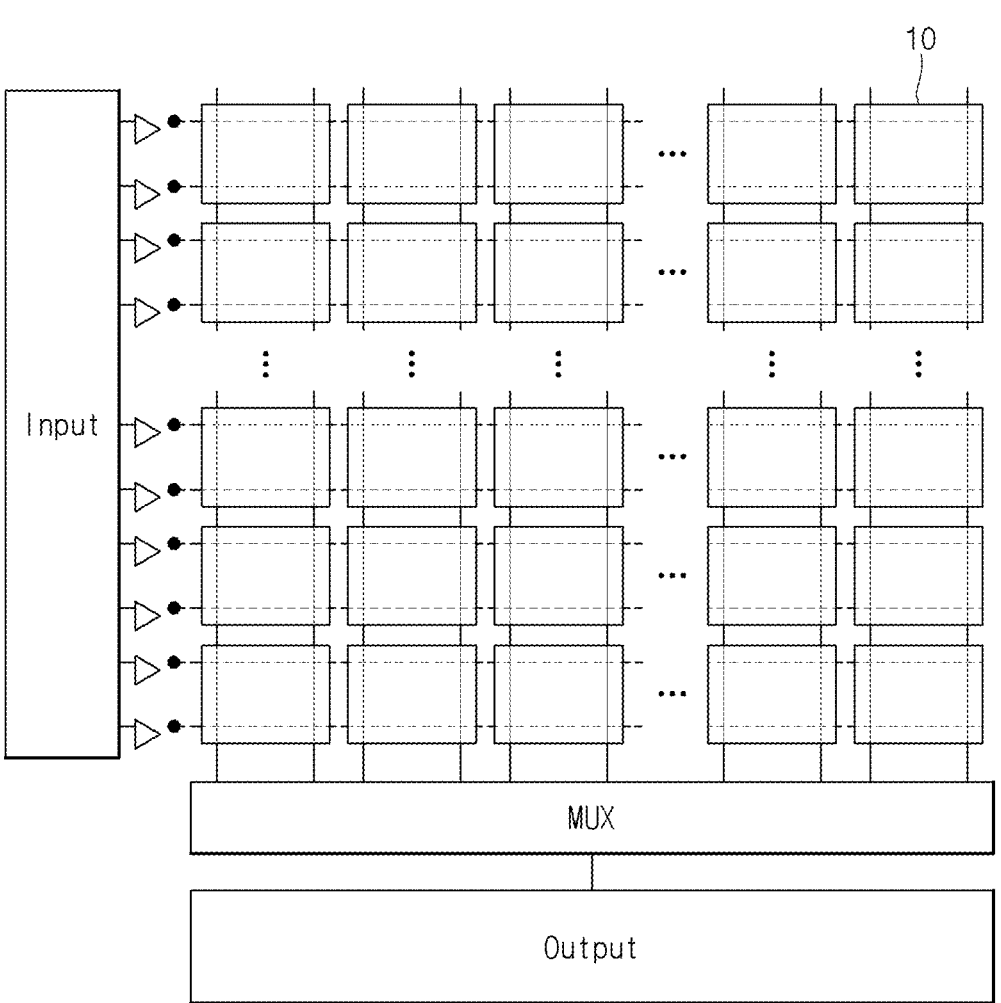
FIG. 1 is a bit cell array in which the present disclosure is implemented.

FIG. 1 is a bit cell array in which the present disclosure is implemented.

The bit cell array will be described with reference to this drawing as follows.

A plurality of bit cells 10 are arranged in a matrix form with columns and rows.

A bit line (BL), a source line (SL), a read word line (RWL), and a write word line (WWL) are disposed in each bit cell 10. In one example, the read word line (RWL) and the write word line (WWL) may be disposed above and below the bit cell (BC), respectively, and the bit line BL and the source line SL may be disposed on the left and right, respectively, with the bit cell 10 in between.

One end of the read word line (RWL) and the write word line (WWL) is connected to the input side and the mode control signal (Vcon) is input, and one end of the bit line (BL) and source line (SL) is connected to the output side through a MUX to output data.

First Embodiment

Figure 2:
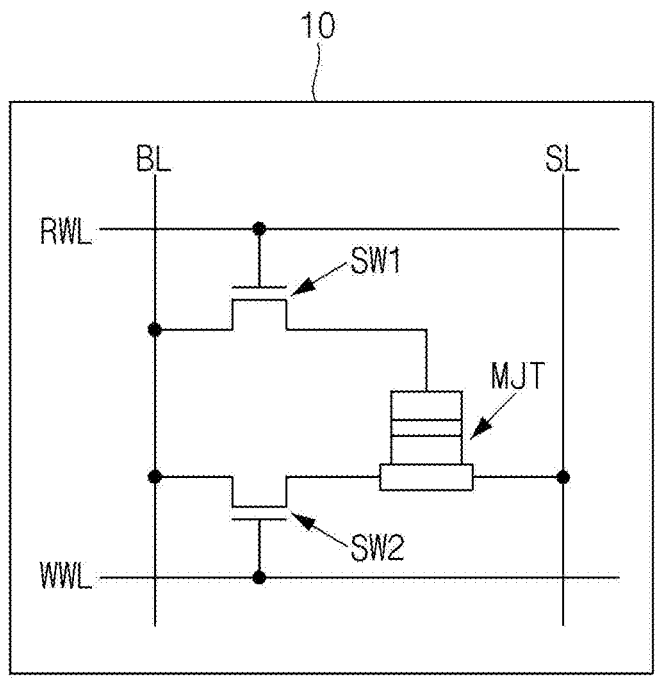
FIG. 2 shows a bit cell according to a first embodiment.

FIG. 2 shows a bit cell according to the first embodiment. Here, each bit cell is implemented as Spin-Orbit Torque Magnetic Random-Access Memory (SOT-MRAM).

The bit cell 10 includes first and second switches (SW1 and SW2), and the switches may be TFTs, MOSFETs, or transistors. The source of the first switch SW1 may be connected to the bit line BL, the gate may be connected to the read word line RWL, and the drain may be connected to one end of the stack MJT, for example, to the fixed layer. The source of the second switch SW2 may be connected to the bit line BL, the gate may be connected to the write word line WWL, and the drain may be connected to the other end of the stack MJT, for example, the free layer side.

The stack (MIT) may have a three-layer structure in which two ferromagnetic layers sandwich a non-magnetic layer. The free layer, one of the two ferromagnetic layers, is a layer that is relatively easy to change the direction of magnetization, and the other fixed layer is made of a very strong magnetic material, so the direction of magnetization is fixed. The reason for this difference is that the energy barriers of the two layers are different. FIG. 2 illustrates, as an example, a stack (MJT) structure in which a free layer, a tunnel barrier layer, and a fixed layer are sequentially stacked on a SOT channel electrode. FIG. 2 illustrates, as an example, a structure in which the stack (MJT) includes a free layer, a tunnel barrier layer, and a fixed layer sequentially stacked on a SOT channel electrode.

Here, the stack (MJT) may be composed of, for example, the following materials, but is not limited thereto.

The free layer may include any of ferromagnetic materials, such as Fe, Co, Ni, B, Si, Zr, Pt, Tb, Pd, Cu, W, Ta, Mn, Ge, Te and Se.

The tunnel barrier layer may include at least one of a non-magnetic material, such as MgO, MgAlO, MgTiO, $Al_2O_3$, $HfO_2$, $TiO_2$, $Y_2O_3$, $Yb_2O_3$, $Gd_2O_3$, ScN, and BN.

The fixed layer may include any one of ferromagnetic materials, such as Fe, Co, Ni, B, Si, Zr, Pt, Tb, Pd, Cu, W, and Ta.

The SOT channel electrode may be formed of a heavy metal material. For example, the heavy metal material may include at least one of Pt, Ni, Mn, Sn, Zn, Ba, Sb, Cd, Bi, V, Se, W, Ta, Te, Co, Mo, Cr, and Ti.

Additionally, a capping layer may be further included above the fixing layer, and for example, the capping layer may include any one of Ta, Ru, W, Mo, Co, Fe, Ni, TIN, CoFe, FeNi, CoNi, CoFeB, CoFeBMo, and CoFeBW.

Figure 3:
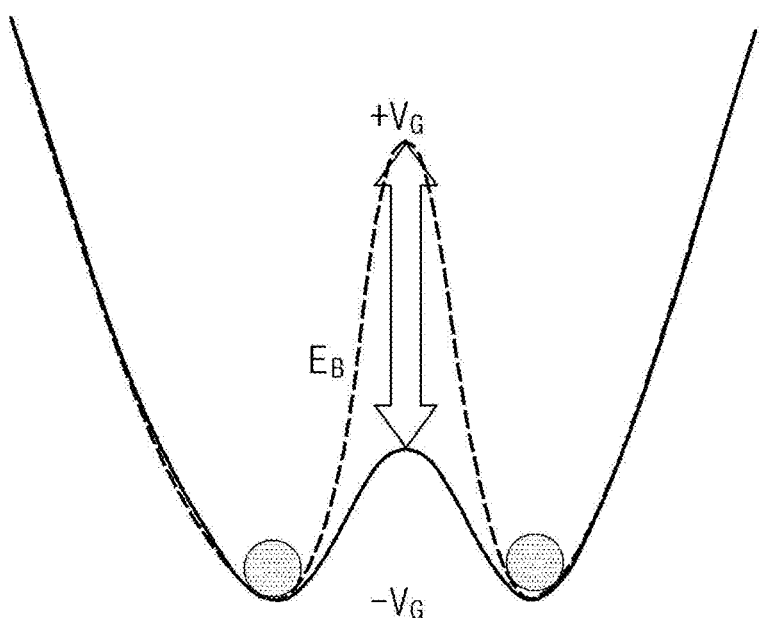
FIG. 3 schematically shows an energy barrier.

FIG. 3 schematically shows the energy barrier, according to the paper Nature Electronics 1, 398-403 (2018), magnetic memory can operate in volatile mode because when the energy barrier (EB) is lowered due to the voltage Controlled Magnetic Anisotropy (VCMA) effect, thermal stability is also lowered, switching current decreases, and switching speed increases. Also, on the contrary, magnetic memory operates in a non-volatile mode when the energy barrier (EB) returns to its original state due to the voltage controlled magnetic anisotropy (VCMA) effect, the thermal stability increases, the switching current increases, and the switching speed decreases. The energy barrier can be adjusted by the bias (−VG, +VG) applied to the stack (MJT), and the size and direction of the bias can be changed depending on the stack and tunnel membrane materials and processes.

In the present disclosure, the magnetic memory is controlled to operate in a dual mode of a non-volatile mode that permanently stores data and a volatile mode that temporarily stores data by using the properties of the magnetic memory. Hereinafter, the dual mode control method of the first embodiment will be described in detail.

[Mode Switching]

A description will be given of how to control the mode according to the first embodiment with reference to FIGS. 2, 4, and 5.

Figure 4:
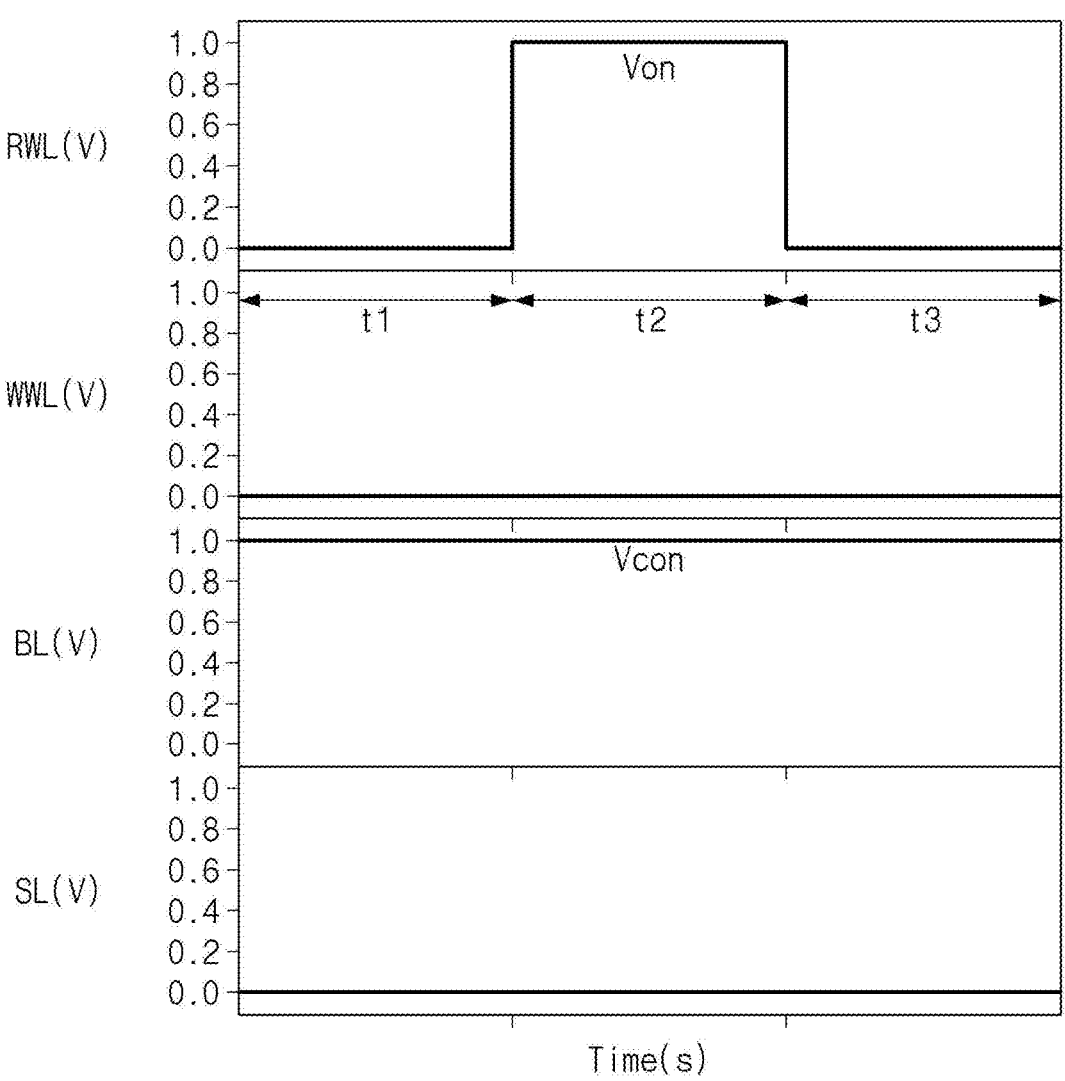
FIG. 4 is a timing diagram of signals for operating in a non-volatile mode according to a first embodiment.
Figure 5:
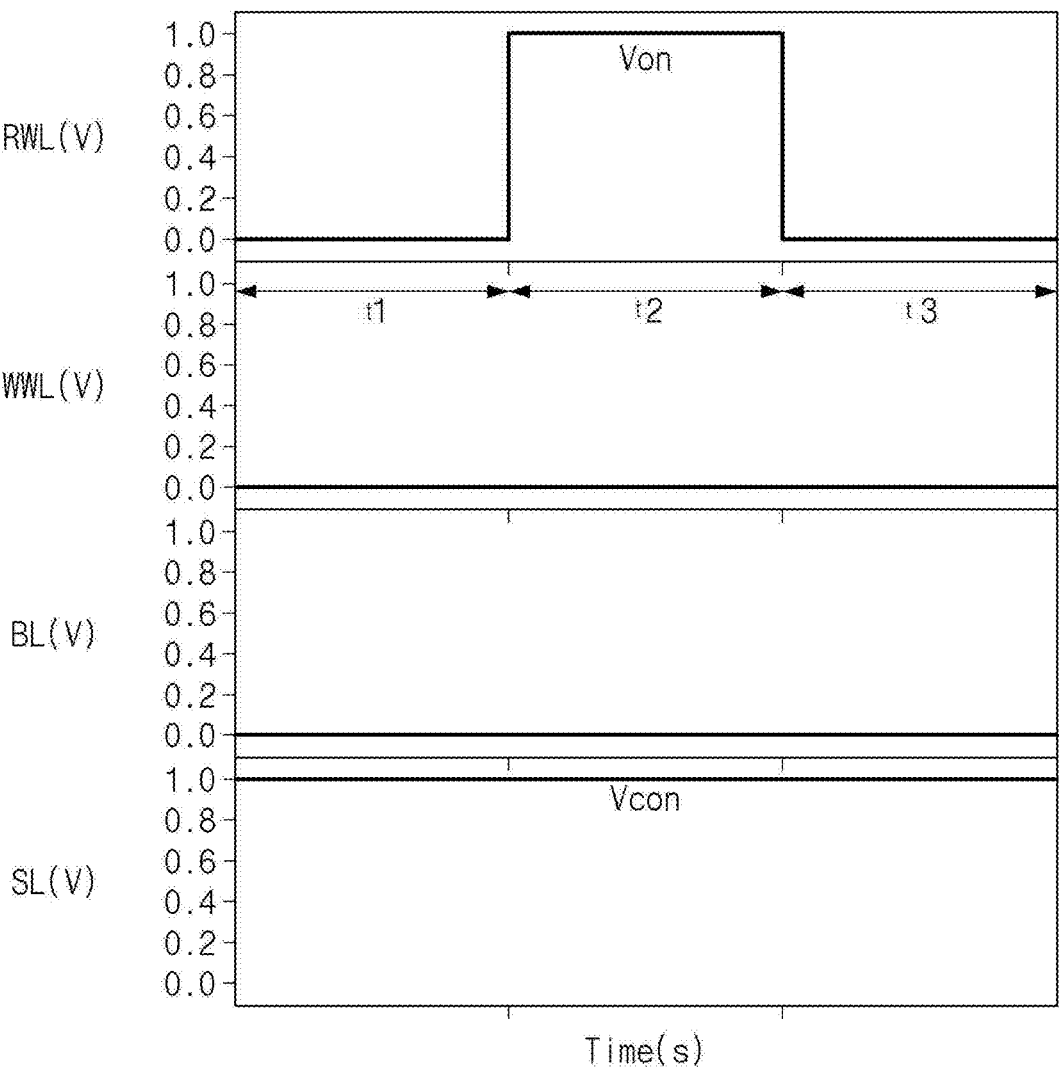
FIG. 5 is a timing diagram of signals for operating in a volatile mode according to a first embodiment.

FIG. 4 is a timing diagram of signals for operating in a non-volatile mode in the first embodiment, and FIG. 5 is a timing diagram of signals for operating in a volatile mode in the first embodiment.

1. Non-Volatile Mode (FIG. 4)

As shown in FIG. 4, in order for the magnetic memory to operate in a non-volatile mode, the energy barrier must be created in the first state (dotted line in FIG. 3, T1). Accordingly, in the first embodiment, the mode control signal Vcon is supplied to the stack MJT to raise the energy barrier EB to the first state.

The detailed timing of the signals is explained as follows.

During the first time t1, the ground (GND) is input to the read word line (RWL), write word line (WWL), and source line (SL), and a mode control signal (Vcon) is input to the bit line (BL). Here, the mode control signal Vcon is a bias for increasing the energy barrier EB from the second state (solid line in FIG. 3) to the first state. The voltage magnitude of this mode control signal (Vcon) is determined depending on the material that makes up the stack (MTJ).

During the first time t1, since the first switch SW1 is turned off, the mode control signal Vcon is not applied to the stack MTJ and is in a floating state.

During the second time t2, a blinking signal Von is input to the read word line RWL, ground (GND) is input to the light word line (WWL) and source line (SL), and a mode control signal (Vcon) is input to the bit line (BL).

Accordingly, as the first switch (SW1) is turned on, the mode control signal (Vcon) is input to one side (for example, fixed layer) of the stack (MTJ) through the bit line (BL), and the ground voltage is applied to the other side (for example, free layer), so that an electric field is formed in a direction from top to bottom based on the drawing. Accordingly, as the energy barrier (EB) rises from the second state (T2) to the first state (T1), the magnetic memory enters a non-volatile mode. Here, the signal size of the mode control signal Vcon or the direction of the electric field is determined depending on the material constituting the stack MTJ, and based on FIG. 3, the signal size is a voltage signal with a size corresponding to +VG. In addition, the pulse width of the mode control signal (Vcon) is determined depending on the material that makes up the stack (MTJ), and has a value of 1 ns to 1 ms, and according to current research, it can be <10 (ns).

After the mode is changed, since the magnetic memory maintains that mode, at the third time t3, the ground (GND) is input to the read word line (RWL), write word line (WWL), and source line (SL). Also, the mode control signal Vcon is input to the bit line BL, but since the first switch SW1 is turned off, the mode control signal Vcon is not input to the stack MTJ.

Meanwhile, in the above description, it has been described that the mode control signal Vcon is applied to the bit line BL for the first to third times, but the mode control signal (Vcon) may be synchronized to the blinking signal (Von) and may be a signal of the same type as the mode control signal (Vcon).

2. Volatile Mode (FIG. 5)

As shown in FIG. 5, in order for the magnetic memory to operate in a volatile mode, the energy barrier (EB) must be created in the second state (blue, T2 in FIG. 3). Accordingly, in the first embodiment, the mode control signal Vcon is supplied to the stack MJT to lower the energy barrier EB to the second state.

The detailed timing of the signals is explained as follows.

During the first time t1, the ground voltage GND is input to the read word line RWL, the write word line WWL, and the bit line BL, and a mode control signal (Vcon) is input to the source line (SL). Here, the mode control signal Vcon is a bias for lowering the energy barrier EB from the first state T1 to the second state T2. The voltage magnitude of this mode control signal (Vcon) is determined depending on the material that makes up the stack (MTJ).

During the first time T1, the first and second switches SW1 and SW2 are turned off, so the mode control signal Vcon is not applied to the stack MTJ and is in a floating state.

During the second time T2, a blinking signal Von is input to the read word line RWL, a ground (GND) is input to the light word line (WWL) and bit line (BL), and a mode control signal (Vcon) is input to the source line (SL).

Accordingly, as the first switch SW1 is turned on, since the ground voltage GND is input to one side of the stack MTJ through the bit line BL, and the mode control signal Vcon is applied to the other side, an electric field is formed in a direction from bottom to top based on the drawing, which is the opposite direction compared to the non-volatile mode. Accordingly, as the energy barrier (EB) is lowered from the first state (T1) to the second state (T2), the magnetic memory goes into the volatile mode. Here, the signal size of the mode control signal Vcon is determined depending on the material constituting the stack MTJ, and based on FIG. 3, it is a voltage signal with a size corresponding to −VG. Additionally, the pulse width of the mode control signal Vcon is determined depending on the material constituting the stack MTJ.

After the mode is changed, since the magnetic memory maintains that mode, the ground (GND) is input to the read word line (RWL), write word line (WWL), and bit line (BL) at the third time T3. Also, the mode control signal (Vcon) is input to the source line (SL), but since the first switch (SW1) is turned off, it is in a floating state.

Meanwhile, in the above description, it is explained that the mode control signal (Vcon) is applied to the source line (SL) for the first to third times, but the mode control signal (Vcon) may be synchronized to the blinking signal (Von) and may be a signal of the same type as the mode control signal (Vcon).

[Selective Mode Switching]

Meanwhile, in order to switch the mode of a specific (i, j) bit cell in an M×N array, the mode of the corresponding bit cell can be switched by applying a signal as shown in Table 1 to each bit cell.

TABLE 1

| Mode | RWL | WWL | BL | SL |
|---|---|---|---|---|
| Non-volatile mode | $V_{ON}$ | GND(0V) | $V_{con}$ | GND(0V) |
| Volatile mode | $V_{ON}$ | GND(0V) | GND(0V) | $V_{CON}$ |

Hereinafter, a method for writing and reading data to magnetic memory will be described in detail.

[Write Operation]

When considering energy efficiency, it is preferable to write data when the magnetic memory is in a volatile mode rather than a non-volatile mode. Therefore, the write operation assumes that the magnetic memory is in volatile mode.

Magnetic memory consists of the relative orientation of two magnetic layers, that is, low resistance (if parallel), high resistance (if anti-parallel) state depending on parallel or anti-parallel, and the parallel state (P) can be expressed as digital 0, and the anti-parallel state (AP) can be expressed as digital 1.

Before explaining the operation, it is assumed that the fixed layer of the stack is switched in the UP direction, and the free layer switches in the UP direction when current flows from the bit line (BL) to the source line (SL). The reason for this assumption is that the magnetization direction is a variable that not only depends on the structure and constituent materials of the stack and the process, but also on the material of the SOT channel.

Figure 6:
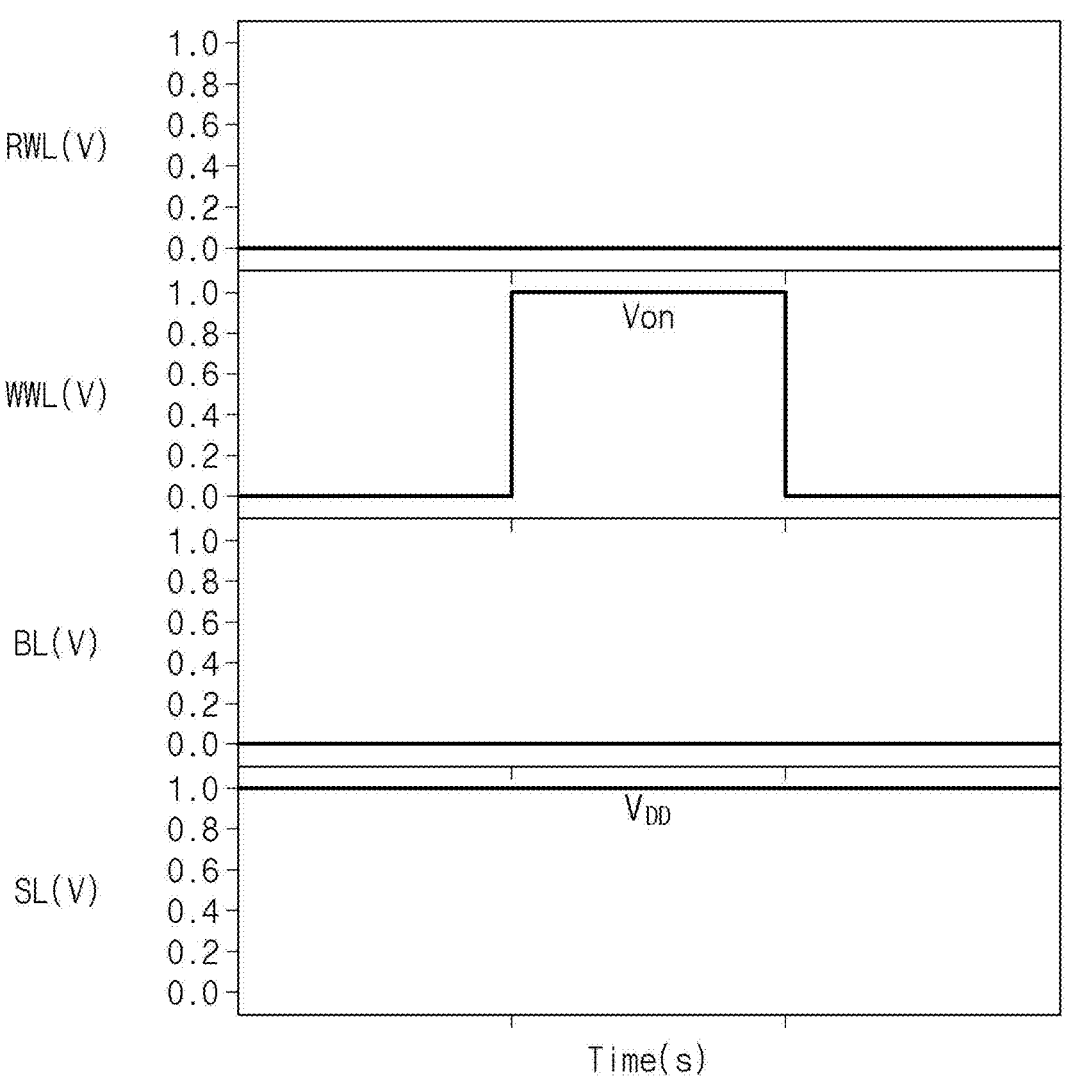
FIG. 6 is a timing diagram when writing data 1 according to a first embodiment.
Figure 7:
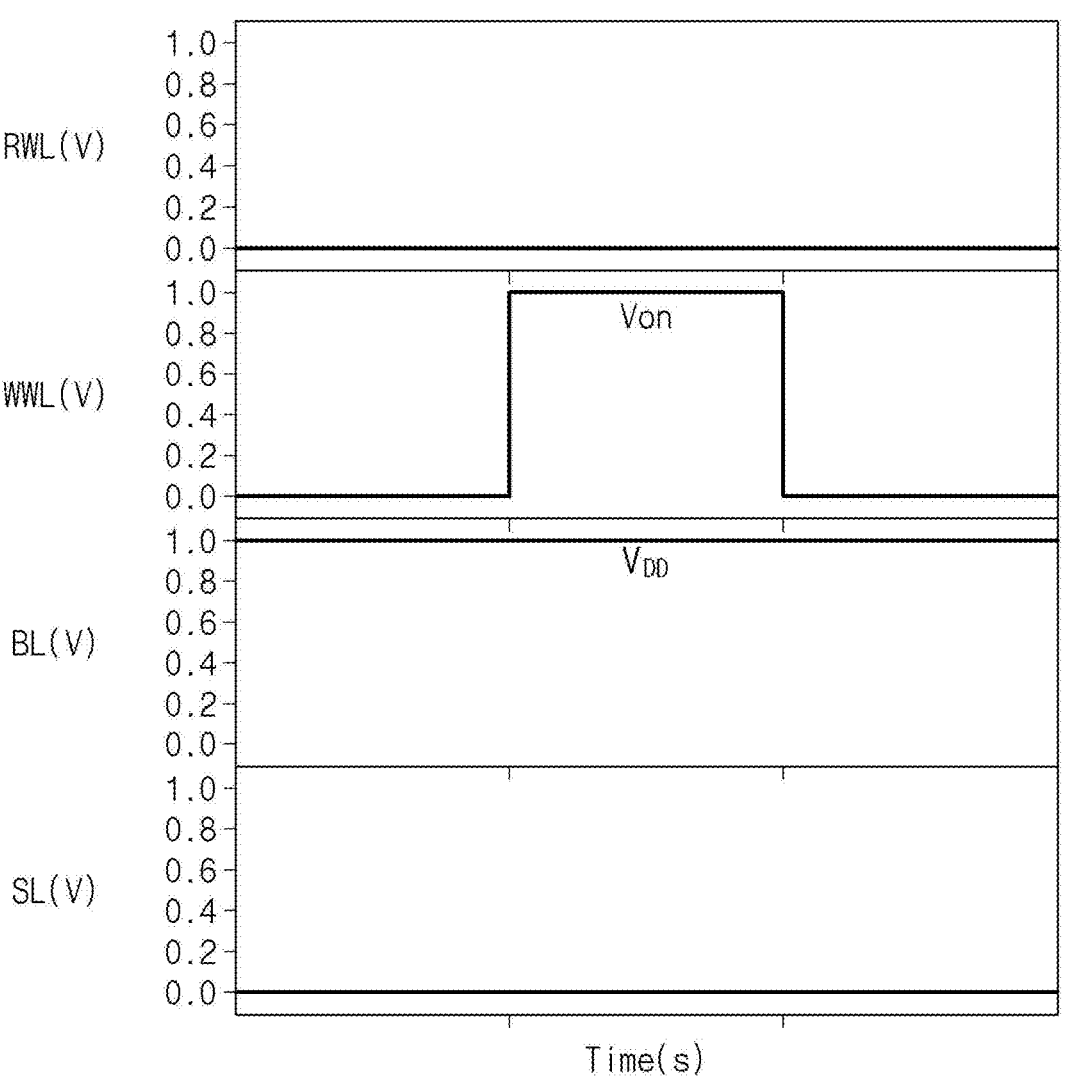
FIG. 7 is a timing diagram when writing data 0 according to a first embodiment.

The write operation based on the bit cell as shown in FIG. 2 will be described with reference to the timing diagrams of FIGS. 6 and 7 as follows. Here, FIG. 6 is a timing diagram when writing data 1 in the first embodiment, and FIG. 7 is a timing diagram when writing data 0 in the first embodiment.

First, Table 2 shows the voltage, magnetization direction, and data applied to each signal line during a write operation.

TABLE 2

| Writing | Magnetization direction | RWL | WWL | BL | SL |
|---|---|---|---|---|---|
| 1(AP) | DOWN | GND(0 V) | $V_{ON}$ | GND(0 V) | $V_{DD}$ |
| 0(P) | UP | GND(0 V) | $V_{ON}$ | $V_{DD}$ | GND(0 V) |

In order to write data 1, since the fixed layer is in the UP direction, the free layer must be in the DOWN direction, which is anti-parallel (AP) with the fixed layer. And, since it is assumed that the free layer switches in the UP direction when current flows from the bit line (BL) to the source line (SL), while the blinking signal (Von) is applied to the write word line (WWL), the data voltage (VDD) is applied to the source line (SL) and the ground voltage (GND) is applied to the bit line (BL). Since the second switch (SW2) is turned on by the blinking signal (Von), by applying a bias from the source line (SL) to the bit line (BL), the magnetization direction of the free layer can be switched to the DOWN direction, which is in anti-parallel state (AP) with the magnetization direction of the fixed layer, and accordingly, data 1 can be written to the bit cell.

At this time, the current pulse width applied for writing is determined according to the ON time of the write word line (WWL), and since it can be at the level of <10 (ns), data can be written at a very high speed.

Meanwhile, the magnetization direction of the fixed layer constituting the stack is said to be a variable dependent on the structure and constituent materials of the stack, and the process. The tables below illustrate the voltage, magnetization direction, and data applied to each signal line during a write operation for each case.

First, Table 3 below shows that the magnetization direction of the fixed layer is in the UP direction, and signals when signals are written in the case where the free layer is switched to the UP direction when current flows from the bit line (BL) to the source line (SL).

TABLE 3

| Writing | Magnetization direction | RWL | WWL | BL | SL |
|---|---|---|---|---|---|
| 1(AP) | DOWN | GND(0 V) | $V_{ON}$ | GND(0 V) | $V_{DD}$ |
| 0(P) | UP | GND(0 V) | $V_{ON}$ | $V_{DD}$ | GND(0 V) |

When using data 1, since the magnetization direction of the free layer must be anti-parallel with the fixed layer, a ground voltage is applied to the bit line BL and a data voltage VDD is applied to the source line SL while the second switch SW2 is turned on.

When using data 0, since the magnetization direction of the free layer must be in parallel with the fixed layer, the data voltage VDD is applied to the bit line BL and the ground voltage is applied to the source line SL while the second switch SW2 is turned on.

Table 4 shows the signals when the free layer is switched in the DOWN direction according to the data to be written, in case that the magnetization direction of the fixed layer is UP direction and the current flows from the bit line (BL) to the source line (SL).

TABLE 4

| Writing | Magnetization direction | RWL | WWL | BL | SL |
|---|---|---|---|---|---|
| 1(AP) | DOWN | GND(0 V) | $V_{ON}$ | $V_{DD}$ | GND(0 V) |
| 0(P) | UP | GND(0 V) | $V_{ON}$ | GND(0 V) | $V_{DD}$ |

When using data 1, since the magnetization direction of the free layer must be anti-parallel to the fixed layer, the data voltage VDD is applied to the bit line BL and the ground voltage is applied to the source line SL while the second switch SW2 is turned on.

When writing data 0, since the magnetization direction of the free layer must be parallel to the fixed layer, a ground voltage is applied to the bit line BL and a data voltage VDD is applied to the source line SL while the second switch SW2 is turned on.

Table 5 shows the signals when the free layer is switched in the UP direction according to the data to be written, in case that the magnetization direction of the fixed layer is DOWN direction and the current flows from the bit line (BL) to the source line (SL).

TABLE 5

| Writing | Magnetization direction | RWL | WWL | BL | SL |
|---|---|---|---|---|---|
| 1(AP) | UP | GND(0 V) | $V_{ON}$ | $V_{DD}$ | GND(0 V) |
| 0(P) | DOWN | GND(0 V) | $V_{ON}$ | GND(0 V) | $V_{DD}$ |

When using data 1, since the magnetization direction of the free layer must be anti-parallel to the fixed layer, the data voltage VDD is applied to the bit line BL and the ground voltage is applied to the source line SL while the second switch SW2 is turned on.

When writing data 0, since the magnetization direction of the free layer must be parallel to the fixed layer, a ground voltage is applied to the bit line BL and a data voltage VDD is applied to the source line SL while the second switch SW2 is turned on.

Table 6 shows the signals when the free layer is switched in the DOWN direction according to the data to be written, in case that the magnetization direction of the fixed layer is DOWN direction and the current flows from the bit line (BL) to the source line (SL).

TABLE 6

| Writing | Magnetization direction | RWL | WWL | BL | SL |
|---|---|---|---|---|---|
| 1(AP) | UP | GND(0 V) | $V_{ON}$ | GND(0 V) | $V_{DD}$ |
| 0(P) | DOWN | GND(0 V) | $V_{ON}$ | $V_{DD}$ | GND(0 V) |

When using data 1, since the magnetization direction of the free layer must be anti-parallel to the fixed layer, a ground voltage is applied to the bit line BL and a data voltage VDD is applied to the source line SL while the second switch SW2 is turned on.

When writing data 0, since the magnetization direction of the free layer must be parallel to the fixed layer, the data voltage VDD is applied to the bit line BL and the ground voltage is applied to the source line SL while the second switch SW2 is turned on.

[Read Operation]

Since data can be read regardless of the mode of the magnetic memory, the read operation operates the same regardless of the mode.

Figure 8:
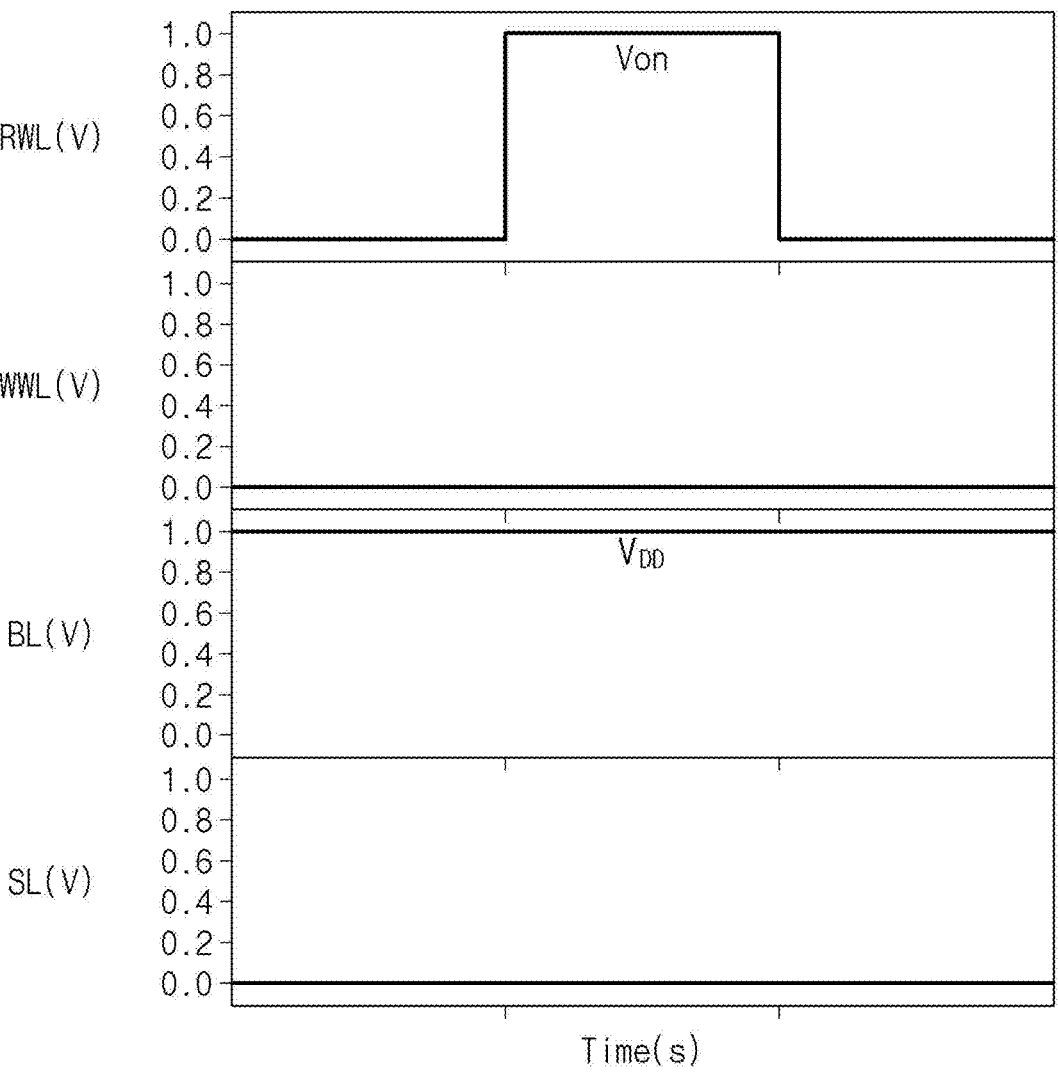
FIG. 8 is a timing diagram during a read operation according to a first embodiment.

The read operation based on the bit cell as shown in FIG. 2 will be described with reference to the timing diagram in FIG. 8 as follows. Here, FIG. 8 is a timing diagram during a read operation. Additionally, Table 7 below shows the voltage applied to each signal line during a read operation.

TABLE 7

| RWL | WWL | BL | SL |
|---|---|---|---|
| $V_{ON}$ | GND(0 V) | $V_{DD}$ | GND(0 V) |

In the read operation, while the blinking signal (Von) is applied to the read word line (RWL), the data voltage (VDD) is input to the bit line and the ground voltage (GND) is input to the source line (SL).

In this read operation, since the read speed, that is, the pulse width of the Von signal, is determined between 10 ns and 100 ns depending on the operation of the circuit rather than the device, data can be read at a very high speed.

Hereinafter, an example of a dual-mode magnetic memory operating as an artificial intelligence memory in an edge device equipped with artificial intelligence will be described.

Figure 9:
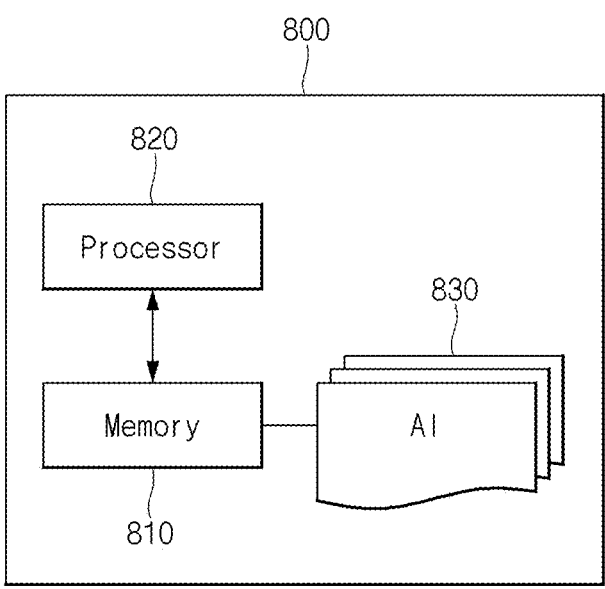
FIG. 9 is an example block diagram of an edge device.

Edge devices refer to devices that generate and process data close to the source of the data, and representative examples include cell phones, drones, and self-driving cars. As exemplarily shown in FIG. 9, the edge device 800 includes a processor 820 that processes data and executes commands, and a memory 810 that stores data. Here, the memory 810 is configured to include the magnetic memory 830 that operates in the above-described dual mode, and the edge device 800 can be implemented with artificial intelligence mounted on the magnetic memory 830.

In this embodiment, the magnetic memory 830 operates in a dual mode of a learning mode according to a learning operation of artificial intelligence and an inference mode according to an inference operation of artificial intelligence. Here, the learning mode refers to an operating state that updates artificial intelligence, and the inference mode refers to an operating state in which artificial intelligence predicts results based on input.

Hereinafter, the operation of each mode will be described as follows.

[Learning Mode]

The learning mode refers to a mode in which the magnetic memory 830 operates in a state in which data can be read and written.

If the edge device 800 determines that artificial intelligence learning is necessary by considering various factors such as environmental factors, hardware factors, or user requests, the mode of the magnetic memory 830, which operates in the inference mode by default, is changed to the learning mode. In one example, since the update of artificial intelligence in learning mode is limited to edge devices, it may not be an update of the entire artificial intelligence, but may be a self-adaptation that adjusts some weights of the neural network that constitutes artificial intelligence, or may be an adjustment of weight to lower the error rate according to variations in chips or devices.

Artificial intelligence receives input values, calculates a weighted sum by applying weights, gives non-linearity using an activation function, and passes it to the next layer. This process is repeated up to the output layer to obtain the final output. Artificial intelligence adjusts weights based on learning data through this process. Therefore, artificial intelligence learning includes both memory reading and writing operations.

To switch to learning mode, as explained with reference to FIG. 5, the edge device 800 generates a potential difference across the stack of all bit cells to lower the energy barrier (EB) from the first state (T1) to the second state (T2). Since the detailed description of this has been explained with reference to FIG. 5, the detailed description is omitted here.

Accordingly, the magnetic memory 830 equipped with artificial intelligence is changed to the learning mode, and after the mode change, the magnetic memory maintains the mode.

Meanwhile, when the edge device determines that artificial intelligence learning is complete, the energy barrier (EB), which was lowered to the second state (T2), is returned to the first state (T1) to change the mode to the inference mode.

[Inference Mode]

The inference mode is a mode in which the magnetic memory 830 operates by default and refers to an operating state in which data is only read. In inference mode, the energy barrier (EB) is maintained in the first state (T1).

This inference mode is the same operating state as the non-volatile mode explained through FIG. 4, and generates a potential difference across the stack of all bit cells to switch the energy barrier (EB) to the first state (T1). Since the detailed description of this has been explained with reference to FIG. 4, the detailed description is omitted here.

Accordingly, the magnetic memory 830 equipped with artificial intelligence is changed to inference mode, after the mode is changed, the magnetic memory maintains that mode, so the magnetic memory 830 operates in the inference mode as default.

If magnetic memory that operates in dual mode is used as memory for artificial intelligence in an edge device, the following effects can be achieved.

Magnetic memory has the advantage of being capable of low-power operation, but has the disadvantage of being slow. However, in the above-described embodiment, the magnetic memory operates in the inference mode by default, so it is suitable as a memory for artificial intelligence in an edge device environment that requires low-power operation.

Additionally, in this embodiment, the magnetic memory can selectively lower the energy barrier to read and write data at high speed. Therefore, by using the magnetic memory operating in the dual mode of the present disclosure, artificial intelligence can be learned from the edge device.

Second Embodiment

Meanwhile, the description of the above-described embodiment described the first embodiment in which the magnetic memory is implemented as Spin-Orbit Torque Magnetic Random-Access Memory (SOT-MRAM).

Hereinafter, a second embodiment in which the magnetic memory is implemented as Spin-Orbit Torque Magnetic Random-Access Memory (SOT-MRAM) will be described, and STT-MRAM, like the above-described SOT-MRAM, can control the operation mode of the memory through the VCMA effect.

Figure 10:
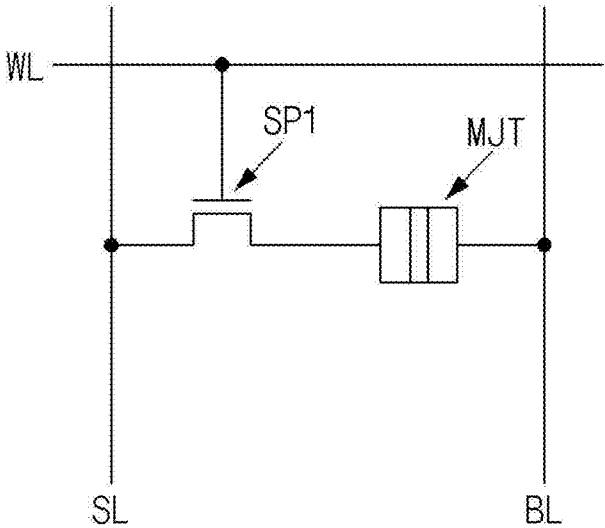
FIG. 10 shows a bit cell according to second embodiment.

FIG. 10 shows a bit cell implemented with STT-MRAM.

In FIG. 10, the bit cell 100 is partitioned by a bit line (BL), a source line (SL), and a word line (WL). In one example, the bit line BL and the source line SL may be disposed on the left and right, respectively, with the stack MJT in between.

One end of the word line (WL) is connected to the input side and the mode control signal (Vcon) is input, and one end of the bit line (BL) and source line (SL) are connected to the output side through a MUX to outputs data.

The bit cell 10 includes a first switch SP1, and the switch may be a TFT, MOSFET, or transistor. The source of the first switch SP1 may be connected to the source line SL, the gate may be connected to the word line WL, and the drain may be connected to one end of the stack MJT, for example, a free layer side. The other end of the stack (MJT), for example, the fixed layer, is connected to the bit line (BL). FIG. 10 illustrates, as an example, a structure in which the stack (MJT) includes a free layer, a tunnel layer, and a fixed layer sequentially stacked in the direction from the source line to the bit line.

In this embodiment, the magnetic memory is controlled to operate in dual mode based on the VCMA effect. Hereinafter, the dual mode control method of the second embodiment will be described in detail.

[Mode Switching]

Figure 11:
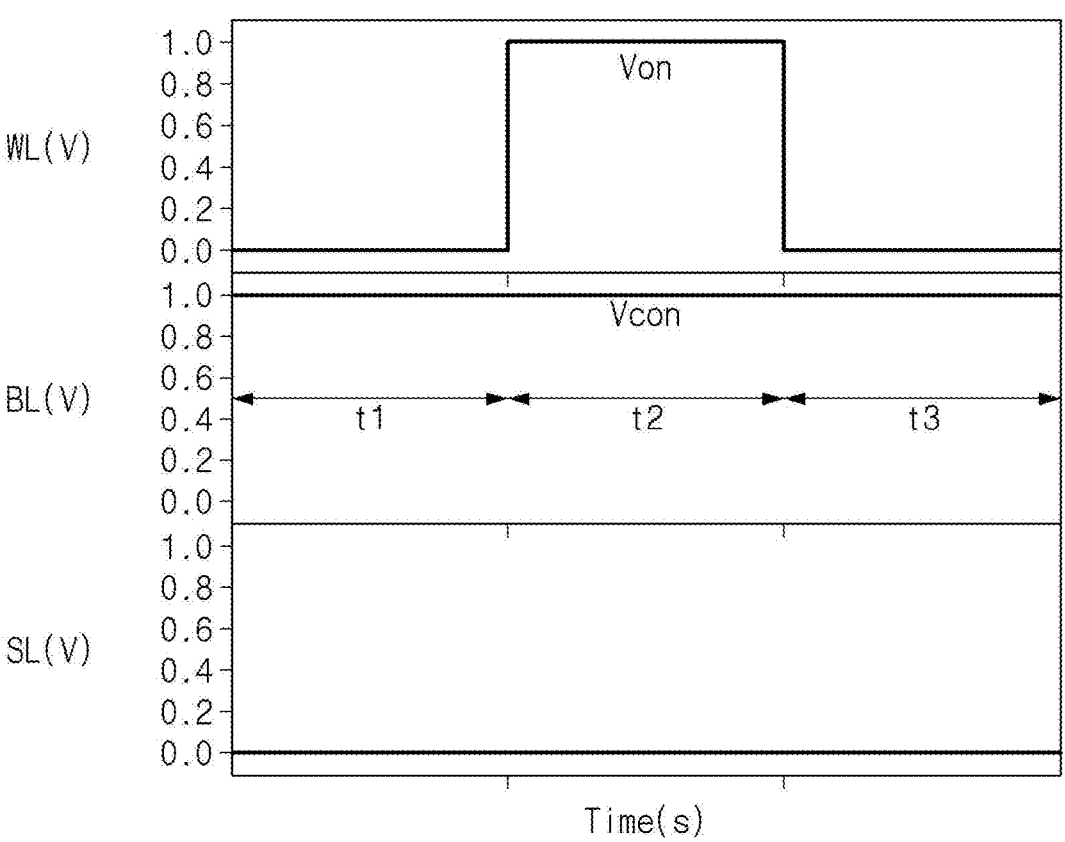
FIG. 11 is a timing diagram of signals for operating in a non-volatile mode according to a second embodiment.
Figure 12:
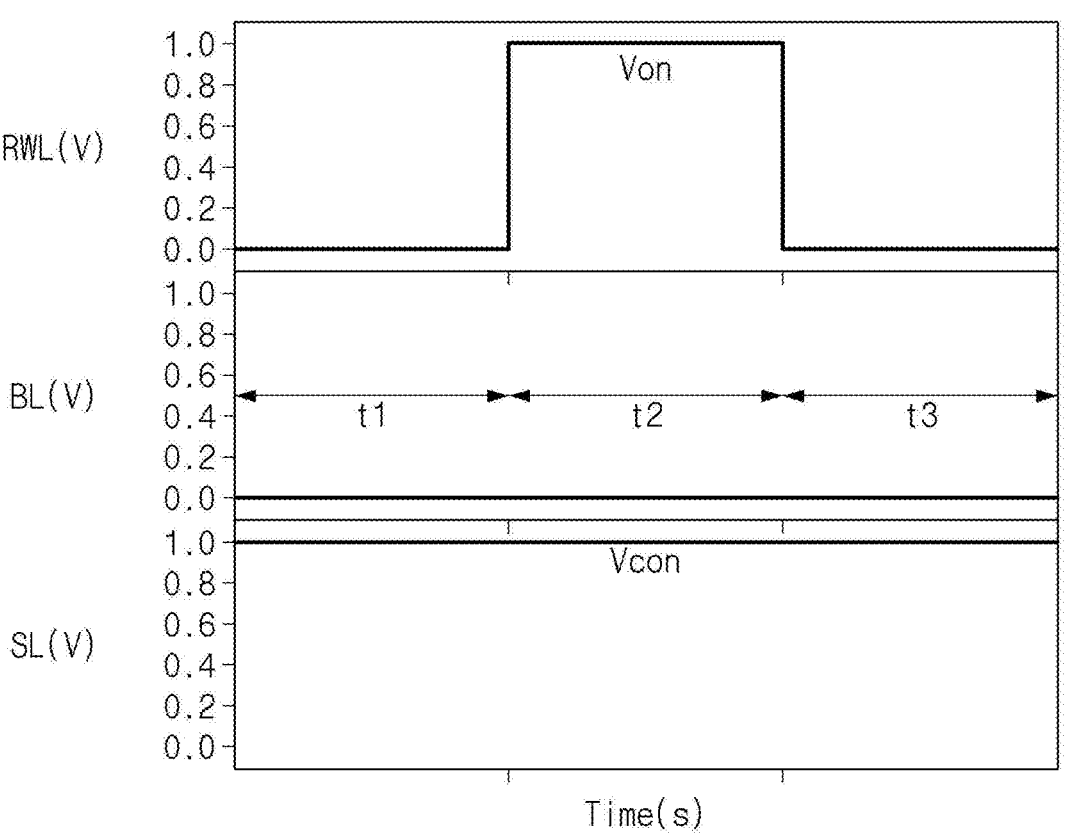
FIG. 12 is a timing diagram of signals for operating in volatile mode according to a second embodiment.

How to control the mode of the magnetic memory will be described with reference to FIGS. 10, 11, and 12.

FIG. 4 is a timing diagram of signals for operating in a non-volatile mode in the second embodiment, and FIG. 5 is a timing diagram of signals for operating in a volatile mode in the second embodiment.

1. Non-Volatile Mode (FIG. 11)

As shown in FIG. 3, when the energy barrier (EB) is in the first state (T1), the magnetic memory operates in a non-volatile mode. The detailed timing of these signals is explained as follows.

During the first time t1, the ground (GND) is input to the word line (WL), and the mode control signal (Vcon) is input to the bit line (BL). Here, the mode control signal Vcon is a bias for increasing the energy barrier EB from the second state (red in FIG. 3) to the first state. The voltage magnitude of this mode control signal (Vcon) is determined depending on the material that makes up the stack (MTJ).

During the first time t1, the first switch SP1 is turned off, so the mode control signal Vcon is in a floating state.

During the second time (t2), a blinking signal (Von) is input to the word line (WL), a ground (GND) is input to the source line (SL), and a mode control signal (Vcon) is input to the bit line (BL).

Accordingly, when the first switch (SP1) is turned on, since the mode control signal (Vcon) is input to one side (e.g. fixed layer) of the stack (MTJ) through the bit line (BL), and to the other side (e.g. free layer) is applied to the ground voltage, above the drawing standard, an electric field is created from the bit line (BL) to the source line (SL). Accordingly, as the energy barrier (EB) rises from the second state (T2) to the first state (T1), the magnetic memory goes into a non-volatile mode. Here, the signal size of the mode control signal (Vcon) or the direction of the electric field is determined depending on the material that makes up the stack (MTJ), and based on FIG. 3, the signal size is a voltage signal with a size corresponding to +VG. In addition, the pulse width of the mode control signal (Vcon) is determined depending on the material that makes up the stack (MTJ), and it has a value in the range of 1 ns to 1 ms, and according to current research, it can be <10 (ns).

After the mode is changed, the magnetic memory maintains the mode, so the ground (GND) is input to the word line (WL) and the source line (SL) at the third time (t3). Also, the mode control signal Vcon is input to the bit line BL, but since the first switch SP1 is turned off, the mode control signal Vcon is not input to the stack MTJ.

Meanwhile, in the above description, it has been described that the mode control signal Vcon is applied to the bit line BL for the first to third times, but the mode control signal (Vcon) may be synchronized to the blinking signal (Von) and may be a signal of the same type as the mode control signal (Vcon).

2. Volatile Mode (FIG. 12)

As shown in FIG. 3, when the energy barrier (EB) is in the second state (T2), the magnetic memory operates in a volatile mode. The detailed timing of these signals is explained as follows.

During the first time t1, the ground voltage GND is input to the word line RWL and the bit line BL, and the mode control signal Vcon is input to the source line SL. Here, the mode control signal Vcon is a bias for lowering the energy barrier EB from the first state T1 to the second state T2. The voltage magnitude of this mode control signal (Vcon) is determined depending on the material that makes up the stack (MTJ).

During the first time T1, the first switch SP1 is turned off, so the mode control signal Vcon is in a floating state.

During the second time (T2), a blinking signal (Von) is input to the word line (RWL), a ground (GND) is input to the bit line (BL), and a mode control signal (Vcon) is input to the source line (SL).

Accordingly, as the first switch SW1 is turned on, since the ground voltage GND is input to one side of the stack MTJ through the bit line BL, and the mode control signal Vcon is applied to the other side, an electric field is formed in a direction from the source line to the bit line based on the drawing, which is the opposite direction compared to the non-volatile mode. Accordingly, as the energy barrier (EB) is lowered from the first state (T1) to the second state (T2), the magnetic memory goes into the volatile mode. Here, the signal size of the mode control signal Vcon is determined depending on the material constituting the stack MTJ, and based on FIG. 3, it is a voltage signal with a size corresponding to −VG. Additionally, the pulse width of the mode control signal Vcon is determined depending on the material constituting the stack MTJ.

After the mode is changed, since the magnetic memory maintains that mode, the ground (GND) is input to the word line (WL), and bit line (BL) at the third time T3. Also, the mode control signal (Vcon) is input to the source line (SL), but since the first switch (SW1) is turned off, it is in a floating state.

Meanwhile, in the above description, it is explained that the mode control signal (Vcon) is applied to the source line (SL) for the first to third times, but the mode control signal (Vcon) may be input in synchronization with the blinking signal (Von).

[Selective Mode Switching]

Meanwhile, in order to switch the mode of a specific (i, j) bit cell in an M×N array, the mode of the corresponding bit cell can be switched by applying a signal as shown in Table 8 to each bit cell.

TABLE 8

| Mode Switching | WL | BL | SL |
|---|---|---|---|
| Non-volatile mode | $V_{ON}$ | $V_{con}$ | GND(0 V) |
| Volatile mode | $V_{ON}$ | GND(0 V) | $V_{con}$ |

In this way, the magnetic memory of the second embodiment can also operate in dual mode by adjusting the energy barrier in the same manner as described above.

In addition, since the operations of reading and writing data are the same as described above, detailed description thereof will be omitted here.

Hereinafter, a method for writing and reading data to the magnetic memory of the second embodiment will be described in detail.

[Write Operation]

Magnetic memory consists of the relative orientation of two magnetic layers, that is, low resistance (if parallel), high resistance (if anti-parallel) state depending on parallel or anti-parallel, and the parallel state (P) can be expressed as digital 0, and the anti-parallel state (AP) can be expressed as digital 1.

Before explaining the operation, it is assumed that magnetization direction of the two magnetic layers is in a parallel state when the current flows from the free layer to the fixed layer. The reason for this assumption is that the magnetization direction is a variable that depends on the structure and constituent materials of the stack and the process.

Figure 13:
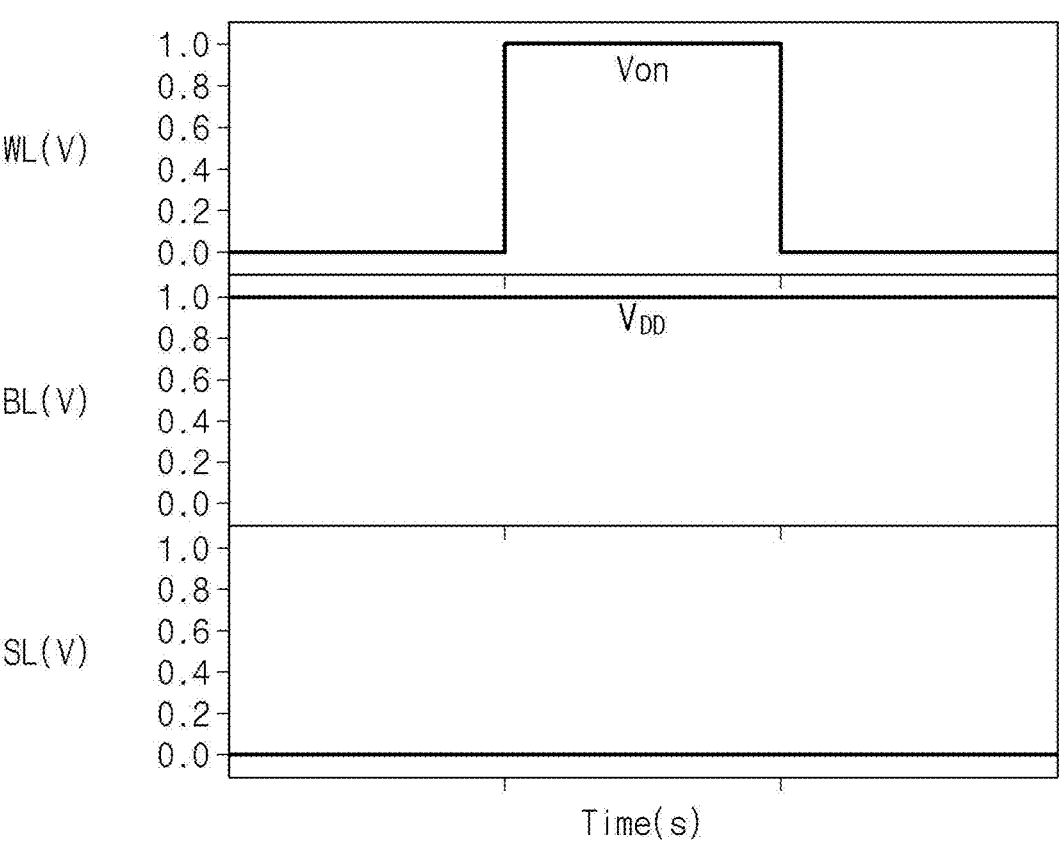
FIG. 13 is a timing diagram when writing data 1 according to a second embodiment.
Figure 14:
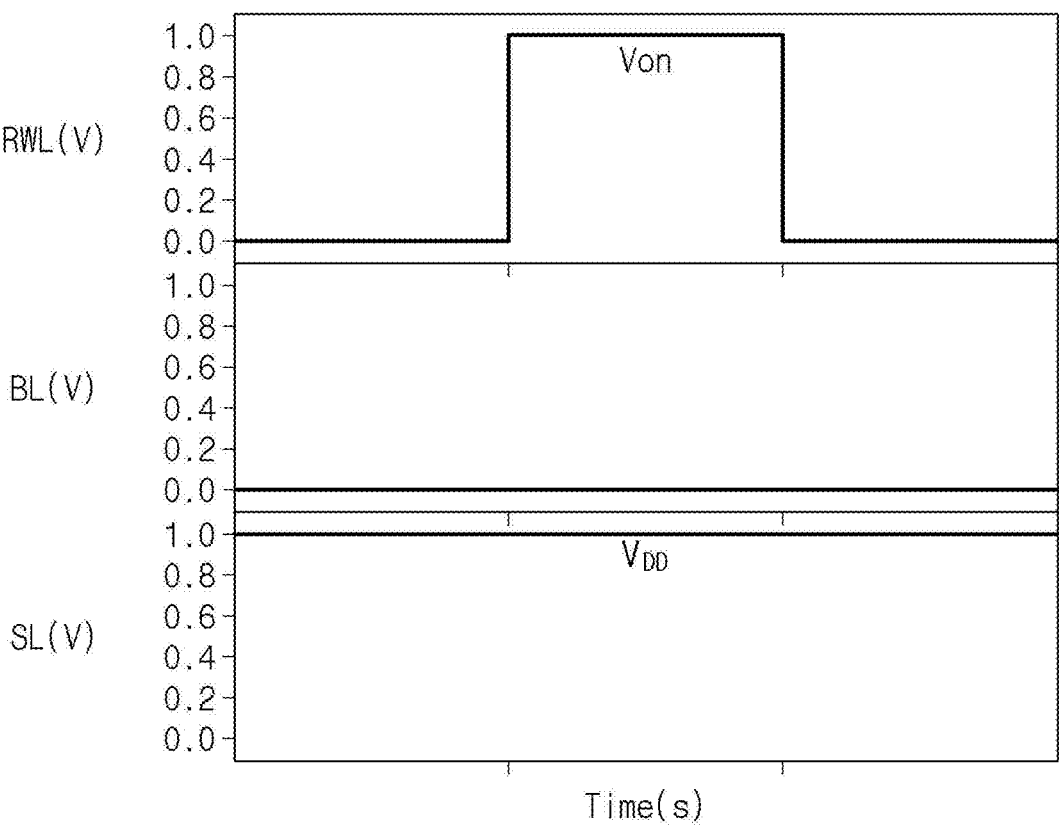
FIG. 14 is a timing diagram when writing data 0 according to a second embodiment.

The write operation based on the bit cell as shown in FIG. 10 will be described with reference to the timing diagrams of FIGS. 13 and 14 as follows. Here, FIG. 13 is a timing diagram when writing data 1, and FIG. 12 is a timing diagram when writing data 0.

First, Table 9 shows signals applied to each signal line during a write operation in the second embodiment.

TABLE 9

| Writing | Current direction | WL | BL | SL |
|---|---|---|---|---|
| 1(AP) | BL –> SL | $V_{ON}$ | $V_{DD}$ | GND(0 V) |
| 0(P) | SL –> BL | $V_{ON}$ | GND(0 V) | $V_{DD}$ |

When writing data 1 (anti-parallel state), since assumption that the current is in a parallel state when it flows from the free layer to the fixed layer, while the blinking signal (Von) is applied to the word line (WL), the data voltage (VDD) is applied to the bit line (BL) and the ground voltage (GND) is applied to the source line (BL). Since the first switch (SP1) is turned on by the blinking signal (Von), a bias is applied from the bit line (BL) to the source line (SL), so that the free layer is in an anti-parallel state (AP) with the fixed layer, and thus data 1 can be written to the bit cell.

At this time, the current pulse width applied to write data is determined according to the ON time of the word line (WL), and two-terminal STT-MRAM is switchable at about 20 ns-200 ns, so data can be written at very high speed.

Meanwhile, the magnetization direction of the fixed layer constituting the stack is said to be a variable dependent on the structure and constituent materials of the stack, and the process. The tables below illustrate signals applied to each signal line during a data write operation for each case.

First, Table 10 below shows the signal when the fixed layer is located at the top (bit line side).

TABLE 10

| Writing | Current direction | WL | BL | SL |
|---|---|---|---|---|
| 1(AP) | BL –> SL | $V_{ON}$ | $V_{DD}$ | GND(0 V) |
| 0(P) | SL –> BL | $V_{ON}$ | GND(0 V) | $V_{DD}$ |

When using data 1 (anti-parallel state, AP), since the magnetization direction of the free layer must be anti-parallel to the fixed layer, while the blinking signal (VON) is applied to the word line (WL), a ground voltage (GND) is applied to the source line (SL) and a data voltage (VDD) is applied to the bit line (BL).

When writing data 0 (parallel state, P), since the magnetization direction of the free layer must be parallel to the fixed layer, a ground voltage (GND) is applied to the bit line (BL), a data voltage (VDD) is applied to the source line (SL), and a blinking signal is applied to the word line to turn on the first switch (SP1).

Table 11 below shows the signal when the fixed layer is located at the bottom (source line side).

TABLE 11

| Writing | Current direction | WL | BL | SL |
|---|---|---|---|---|
| 1(AP) | SL -> BL | $V_{ON}$ | GND(0 V) | $V_{DD}$ |
| 0(P) | BL -> SL | $V_{ON}$ | $V_{DD}$ | GND(0 V) |

When using data 1 (anti-parallel state, AP), since the magnetization direction of the free layer must be anti-parallel to the fixed layer, while the blinking signal (VON) is applied to the word line (WL), a data voltage (VDD) is applied to the source line (SL) and a ground voltage (GND) is applied to the bit line (BL).

When writing data 0 (parallel state, P), since the magnetization direction of the free layer must be parallel to the pinned layer, a data voltage (VDD) is applied to the bit line (BL), a ground voltage (GND) is applied to the source line (SL), and a blinking signal is applied to the word line to turn on the first switch (SP1).

[Read Operation]

Since data can be read regardless of the mode of the magnetic memory, the read operation operates the same regardless of the mode.

Figure 15:
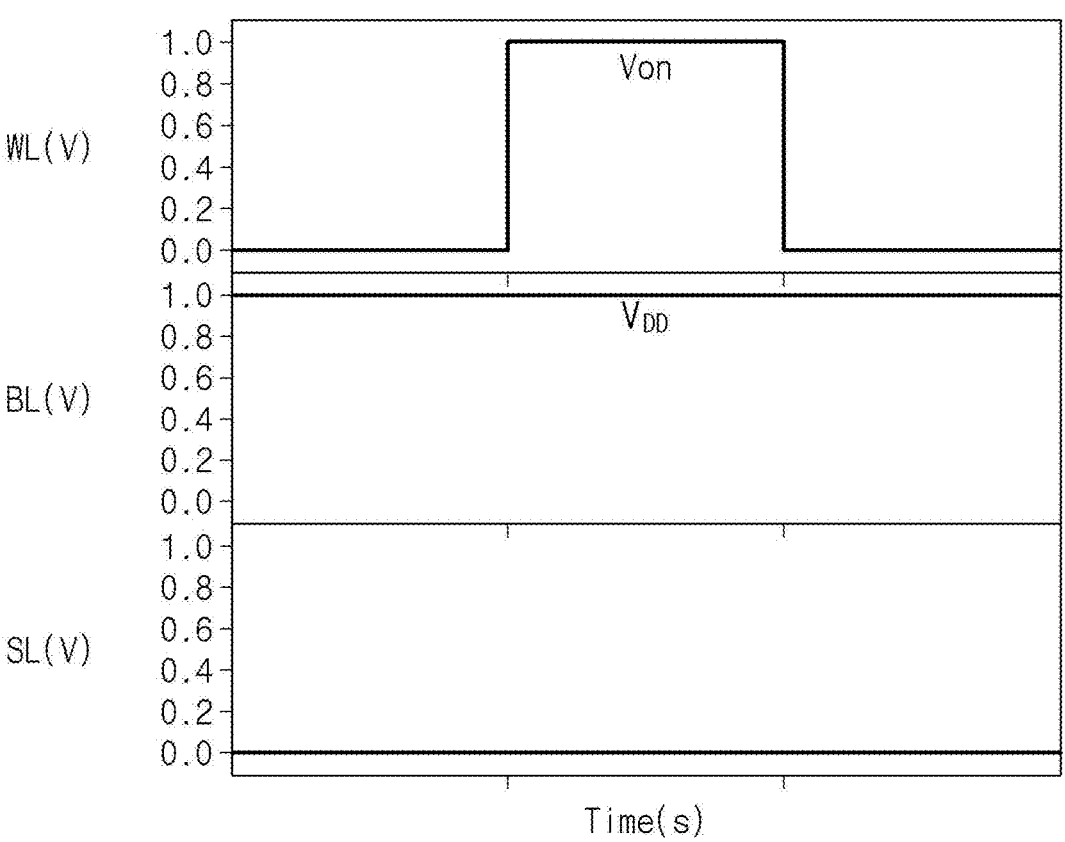
FIG. 15 is a timing diagram during a read operation according to a second embodiment.

The read operation based on the bit cell shown in FIG. 10 will be described with reference to the timing diagram in FIG. 15 as follows. Here, FIG. 15 is a timing diagram during a read operation. Additionally, Table 12 below shows the voltage applied to each signal line during a read operation.

TABLE 12

| WL | BL | SL |
|---|---|---|
| $V_{ON}$ | $V_{DD}$ | GND(0 V) |

In a read operation, while the blinking signal (Von) is applied to the word line (WL), a data voltage (VDD) is input to the bit line, and a ground voltage (GND) is input to the source line (SL).

In this read operation, the read speed, that is, the pulse width of the Von signal, is determined between 10 ns and 100 ns depending on the operation of the circuit rather than the device, so data can be read at a very high speed.

In the first embodiment described above, the fact that the magnetic memory is configured as a memory for artificial intelligence in an edge device equipped with artificial intelligence, is substantially the same as the first embodiment described above except that the magnetic memory is implemented as STT-MRAM in the second embodiment, so the detailed description is omitted here.

The first and second embodiments of the present disclosure have been described above. However, the present disclosure is not limited to this, and any magnetic memory capable of adjusting the energy barrier based on the VCMA effect can be implemented in the same manner without particular restrictions.

In the above, the present disclosure has been examined focusing on its various embodiments. Those skilled in the art of the present disclosure will understand that various embodiments may be implemented in modified forms without departing from the essential characteristics of the present disclosure. Therefore, the disclosed embodiments should be considered from an illustrative rather than a restrictive perspective. The scope of the present disclosure is indicated in the claims rather than the foregoing description, and all differences within the equivalent scope should be construed as being included in the present disclosure.

What is claimed is:

1. A magnetic memory comprising:
a three-layer MTJ stack including a fixed layer with magnetization fixed by magnetic tunnel junction stack, a free layer with non-fixed magnetization, and a tunnel barrier layer disposed therebetween,
wherein the magnetic memory operates in a volatile mode and a non-volatile mode by switching an energy barrier to one of a first state and a second state lower than the first state by an electric field applied to both ends of the MTJ stack.

2. The magnetic memory of claim 1, wherein the volatile mode is a mode in which the energy barrier is in the second state.

3. The magnetic memory of claim 1, wherein data is read or written in the volatile mode, and, the data is stored during the non-volatile mode.

4. The magnetic memory of claim 1, wherein the volatile mode and the non-volatile mode are determined by a ground voltage applied to one end of the MTJ stack and a mode control signal applied to the other end.

5. The magnetic memory of claim 4, wherein the mode control signal is applied to the MTJ stack through a switch that is turned on/off by a blinking signal.

6. The magnetic memory of claim 1, wherein the magnetic memory is Spin-Orbit Torque Magnetic Random-Access Memory (SOT-MRAM).

7. The magnetic memory of claim 6, wherein the volatile mode is formed by an electric field directed from the free layer to the fixed layer.

8. The magnetic memory of claim 7, wherein a ground voltage is applied to the fixed layer, and
a mode control signal higher than the ground voltage is applied to the free layer.

9. The magnetic memory of claim 7, wherein the ground voltage is applied through a source line, and
the mode control signal is applied through a bit line when a first switch is turned on by a blinking signal input through a read word line.

10. The magnetic memory of claim 6, wherein the non-volatile mode is formed by an electric field directed from the fixed layer to the free layer.

11. The magnetic memory of claim 10, wherein a ground voltage is applied to the free layer, and
a mode control signal higher than the ground voltage is applied to the fixed layer.

12. The magnetic memory of claim 11, wherein the ground voltage is applied through a bit line when a first switch is turned on by a blinking signal input through a read word line, and
the mode control signal is applied through a source line.

13. The magnetic memory of claim 1, wherein the magnetic memory is Spin Transfer Torque Magnetic Random-Access Memory (STT-MRAM).

14. The magnetic memory of claim 13, wherein the volatile mode is formed by an electric field directed from the free layer to the fixed layer.

15. The magnetic memory of claim 14, wherein a ground voltage is applied to the fixed layer, and
a mode control signal higher than the ground voltage is applied to the free layer.

16. The magnetic memory of claim 15, wherein the ground voltage is applied through a bit line, and
the mode control signal is applied through a source line when a first switch is turned on by a blinking signal input through a word line.

17. The magnetic memory of claim 13, wherein the non-volatile mode is formed by an electric field directed from the fixed layer to the free layer.

18. The magnetic memory of claim 17, wherein a ground voltage is applied to the free layer, and a mode control signal higher than the ground voltage is applied to the fixed layer.

19. The magnetic memory of claim 18, wherein the ground voltage is applied through a source line when the first switch is turned on by a blinking signal input through a word line, and the mode control signal is applied through a bit line.

20. A memory for artificial intelligence that stores the artificial intelligence in an edge device, wherein the memory is a magnetic memory according to claim 1, the magnetic memory operates in an inference mode and a learning mode by switching an energy barrier to one of a first state and a second state lower than the first state by an electric field applied to both ends of the MTJ stack, the learning mode is a mode that operates to read and write data to update the artificial intelligence, and the inference mode is a mode that only reads data.

\* \* \* \* \*